US011195559B2

(12) United States Patent
Choi et al.

(10) Patent No.: US 11,195,559 B2
(45) Date of Patent: *Dec. 7, 2021

(54) SLIDER TEST SOCKET WITH CLAMP, AND RELATED ASSEMBLIES AND METHODS OF USE

(71) Applicant: Seagate Technology LLC, Fremont, CA (US)

(72) Inventors: Sungkwon Choi, Minneapolis, MN (US); Stefan A. Weissner, Bloomington, MN (US); Razman Zambri, Eden Prairie, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,680

(22) Filed: Jun. 8, 2020

(65) Prior Publication Data

US 2020/0302972 A1 Sep. 24, 2020

Related U.S. Application Data

(63) Continuation of application No. 16/229,976, filed on Dec. 21, 2018, now Pat. No. 10,679,679.

(51) Int. Cl.
| | |
|---|---|
| *G11B 5/455* | (2006.01) |
| *G11B 27/36* | (2006.01) |
| *G11B 5/09* | (2006.01) |
| *F16B 2/02* | (2006.01) |
| *F16B 2/12* | (2006.01) |
| *G01R 31/26* | (2020.01) |

(52) U.S. Cl.
CPC .............. *G11B 27/36* (2013.01); *F16B 2/02* (2013.01); *F16B 2/12* (2013.01); *G11B 5/09* (2013.01); *G11B 5/455* (2013.01); *G01R 31/26* (2013.01)

(58) Field of Classification Search
None
See application file for complete search history.

(56) References Cited

U.S. PATENT DOCUMENTS

| | | | | |
|---|---|---|---|---|
| 5,553,525 | A | * | 9/1996 | Mailey ................... B21D 28/30 83/184 |
| 5,634,578 | A | | 6/1997 | Best |
| 6,585,212 | B2 | | 7/2003 | Carnevali |
| 6,700,749 | B2 | | 3/2004 | Shiraishi et al. |
| 7,302,898 | B1 | | 12/2007 | Martelli |

(Continued)

FOREIGN PATENT DOCUMENTS

| | | |
|---|---|---|
| CN | 1357800 A | 7/2002 |
| CN | 101549847 A | 10/2009 |

(Continued)

OTHER PUBLICATIONS

CN Application No. 201911119631.4, Translation of Notice of First Office Action and Search Report, dated Dec. 21, 2020, 5 pages.

*Primary Examiner* — Jefferson A Evans
(74) *Attorney, Agent, or Firm* — Kagan Binder PLLC

(57) ABSTRACT

Described are clamps useful for temporarily holding a slider of a hard disk drive in a test socket for dynamic electrical testing of the slider, as well as related assemblies that include the test socket, a head-gimbal-assembly, a testing assembly, and related methods of use.

20 Claims, 7 Drawing Sheets

(56) References Cited

U.S. PATENT DOCUMENTS

| | | |
|---|---|---|
| 7,784,631 B2 | 8/2010 | Winn et al. |
| 8,089,730 B1 | 1/2012 | Pan et al. |
| 8,134,804 B2 | 3/2012 | Honzawa et al. |
| 8,235,340 B2 | 8/2012 | Carnevali |
| 8,270,117 B2 | 9/2012 | Wakahara |
| 8,300,361 B2 | 10/2012 | Boutaghou et al. |
| 8,395,864 B2 | 3/2013 | Boutaghou et al. |
| 8,514,522 B1 | 8/2013 | Pan et al. |
| 9,776,577 B2 | 10/2017 | Carnevali |
| 9,858,954 B1 | 1/2018 | Saiki et al. |
| 10,626,899 B2 * | 4/2020 | Lien ........................ H04M 1/04 |
| 11,047,519 B2 * | 6/2021 | Lee ...................... F16M 11/041 |
| 2004/0261261 A1 | 12/2004 | Bolde et al. |
| 2006/0236527 A1 * | 10/2006 | Davis ................... G11B 5/4826 |
| | | 29/603.12 |
| 2009/0268329 A1 | 10/2009 | Nojima |
| 2012/0008226 A1 | 1/2012 | Boutaghou et al. |
| 2012/0033318 A1 | 2/2012 | Boutaghou et al. |
| 2013/0008628 A1 | 1/2013 | Tiengtum et al. |
| 2013/0107678 A1 * | 5/2013 | Mukoh .................. G11B 5/455 |
| | | 369/13.32 |
| 2014/0042285 A1 | 2/2014 | Carnevali |
| 2017/0372732 A1 * | 12/2017 | Kudo .................. G01R 33/1207 |
| 2018/0047421 A1 | 2/2018 | Adachi et al. |
| 2018/0240480 A1 | 8/2018 | Zambri et al. |
| 2019/0005980 A1 * | 1/2019 | Takayama ............. G01R 33/032 |
| 2019/0309254 A1 | 10/2019 | Konduru et al. |

FOREIGN PATENT DOCUMENTS

| | | |
|---|---|---|
| CN | 103858165 A | 6/2014 |
| EP | 1 298 735 B1 | 12/2007 |

* cited by examiner

SLIDER TEST SOCKET WITH CLAMP, AND RELATED ASSEMBLIES AND METHODS OF USE

PRIORITY CLAIM

This application is a continuation application of U.S. Ser. No. 16/229,976, filed Dec. 21, 2018, which is incorporated herein by reference in its entirety for all purposes.

FIELD OF THE INVENTION

The following description relates to clamps used for temporarily holding a slider of a hard disk drive in a test socket for testing the slider, as well as related assemblies that include the test socket, a head-gimbal-assembly, a testing assembly, and related methods of use.

BACKGROUND

Hard disk drives used for long term magnetic storage of digital information are ubiquitous and essential devices in our modern world. A hard disk drive device includes one or more rotating magnetic storage disks within an enclosure. To use the hard disk drive to store and retrieve digital information, the hard disk drive device also includes electronic and control mechanisms that are adapted to read and write information from and onto the magnetic disk. One of these components, a "head-gimbal assembly," is part of a suspension assembly that provides electrical connections to a read or write head ("read head" for short). The read head is a component of a "slider" that includes the read head, an air bearing surface, and electrical connections. The suspension assembly typically includes a laminated flexure to carry electrical signals to and from the read head, between the read head and an electronic device such as a computer. The head-gimbal assembly is a component of a head-stack assembly that typically includes multiple head-gimbal assemblies, with each head-gimbal assembly being attached at an end of a suspension arm attached to an actuator.

A read head of a slider includes one or more miniaturized transducers for reading or writing data from or onto the rotating magnetic disk. The slider also includes an air bearing surface to properly position the read head above the disk as the disk rotates. Electronic functionality, including, for example, electrical contact pads and other electrical connections, is also part of the slider The disk includes a magnetic layer that can be selectively magnetized by a write head to store digital information in a manner that allows for retrieval of the information by a read head.

The head-gimbal assembly is attached to an actuator arm (a suspension arm attached to an actuator) that is part of the disk drive, and is held by the actuator arm to place the slider at a location that is adjacent to but not touching a surface of the magnetic disk. As the disk spins, airflow at the spinning disk surface interacts with the air bearing surface of the slider to create a cushion or "bearing" of air flowing through the space that separates the slider from the disk surface. This cushion of air, or "air bearing," suspends the slider and read head at a desired distance from ("above") the disk surface. If the read head is too distant from the surface, signal loss will occur, and if the head is too close to the surface the read head could contact the surface, i.e., "crash," causing damage to the read head or to the disk and often a complete hard drive failure.

Typically, as part of a finished suspension assembly, a slider is permanently bonded to a head-gimbal assembly that is part of a suspension assembly. But before a suspension assembly can be incorporated into a disk drive, the read head of the suspension assembly must be shown to have proper reading and writing capabilities, which requires electronic testing. This type of performance testing is referred to as "dynamic electrical testing" or "DET."

Dynamic electrical testing can be performed with desired accuracy if the testing conditions closely resemble actual conditions during operation of the read head. For example, the accuracy of the dynamic electrical testing may be improved by holding and electrically connecting the read head using a suspension assembly that is similar to a suspension assembly to which the read head will be bonded as part of a final product. But, if the read head is permanently attached to the suspension assembly during this testing, and then is found to be defective, an entire suspension assembly, including the slider, head-gimbal assembly, and actuator arm, must be discarded.

To avoid discarding an entire suspension assembly due to a defective read head, as determined by electronic testing, a desired approach is to test a read head of a slider without permanently bonding the read head (slider) to a head-gimbal assembly. If the read head is found to be defective by testing carried out before the read head is permanently bonded to a suspension assembly, the read head alone can be discarded or repaired, not the larger and higher value suspension assembly.

Test assemblies that simulate a use condition during dynamic electrical testing have been proposed and used commercially. As with most aspect of manufacturing microelectronic devices such as hard disk drives, test methods and testing assemblies for dynamic electrical testing of hard disk drive sliders must be continuously updated and improved.

SUMMARY

Typical commercial scale testing of reading and writing functionalities of a slider, during production, is performed after the slider has been permanently made part of a head-gimbal-assembly (HGA). During this type of testing (sometimes referred to as electrical testing or "ET"), the head-gimbal-assembly is "flown" over a spinning magnetic recording medium surface and important electrical and mechanical parameters of the slider are measured at one or multiple test radii of a recording disk, e.g., bit-error rate or "BER," overwrite "OVW" (which measures how well an existing track can be overwritten by a new track), power-to-contact, and other electronic testing (ET) measurements. If the HGA fails to perform to a necessary level for any one of these parameters, the entire head-gimbal-assembly is discarded, resulting in the loss of both the suspension and the slider.

In improved electronic testing methods, a "testing suspension" is used to temporarily hold a slider during testing. The testing suspension is comparable to a final, commercial suspension, but includes a "test socket" that can temporarily (i.e., releasably) hold a slider in a working fashion as part of a head-gimbal-assembly so that the slider can be temporarily held by a testing system for testing. The slider can be placed into the test socket and the testing suspension can be used for electronic testing of the slider, including testing of read and write head functionalities. Using the testing suspension to temporarily hold the slider for testing achieves significant cost savings and manufacturing efficiencies because, should the slider not pass performance testing, the defective slider alone can be discarded as opposed to a larger and more expensive assembly of the defective slider permanently secured to a head-gimbal assembly and suspension.

A testing suspension of the present invention includes a clamping mechanism ("clamp") that releasably holds a slider in place in a suspension assembly in a manner by which the slider is engaged electronically with the assembly, for testing. A clamp as described typically includes a forward contact surface for engaging one end of a slider, a rear contact surface for engaging an opposite end of the slider, and a space (a "slider space") at an upper portion of the clamp, between the forward contact and the rear contact surface, within which the slider is releasably positioned and held during testing.

Previous clamp designs include springs that are located at the sides of a slider space, i.e., not within the slider footprint, meaning the vertical space that corresponds to the horizontal area of the slider space in a length and width direction relative to the clamp; previous clamp designs include springs that are located lateral to the slider space, and at a vertical level (height, in a z-direction) that is shared with the slider space. The springs, front and back contact surfaces, and a slider space, are all co-located at a single vertical level of the clamp. Because the springs and slider space are located at the same level (vertically), the springs must be located to avoid the slider pace, such as to the left and right sides of the slider space. The springs are not located vertically in the same position as the slider space; the springs do not share the footprint of the slider space. This general design results in the clamp exhibiting physical features that include footprint, total mass, and center-of-gravity and roll inertia, that are reflective of the horizontally-dispersed positioning of the springs lateral to and outside of the footprint of the slider space.

In contrast, the presently-described invention includes a clamp that has springs that are located at a different vertical level of the clamp compared to the slider space, e.g., springs of the clamp can be located at a vertical level that is below the level of the slider space. Placement of the springs vertically below the level of the slider space allows for a spring or a set of springs, or at least a portion of a spring or a set of springs, to be located underneath the slider space, e.g., to share at least in part the same vertical footprint as the footprint of the slider space. As used herein, a "footprint" of a slider, clamp, spring, or another related structure, is area of the structure in the length (x) and width (y) dimensions, extending in a vertical (z) direction. Potential advantages of a clamp of the described design include a reduced overall footprint of the clamp, a reduced mass of the clamp, and potentially improved positional stability of the clamp during use relative to a clamp that has a greater mass, a larger footprint, or a different center of gravity due to having springs located completely outside of a footprint of a slider space. The increased stability of a clamp as described can be shown as reduced vibrations of the clamp during use, especially at resonance frequencies. Reduced vibrations can improve the performance of a slider that is held by the clamp, e.g., during testing, such as by reducing an error rate of the slider during that might be caused by or increased by the design (size, shape, mass, footprint, etc.) of the clamp, including springs of the clamp.

In one aspect, the invention relates to a clamp for removably holding a slider. The clamp includes: a stationary frame that includes a stationary rear frame member at a rear portion of the frame, extending in a width direction; a spring extending in a horizontal plane of the stationary frame; and an open space extending in a length direction and the width direction and located above an upper surface of the spring. The open space is defined in the length direction in part by: a front contact surface at a forward portion of the clamp, extending above the horizontal plane; and a rear contact surface at a rear portion of the clamp, extending above the horizontal plane. The spring connects the stationary frame with the rear contact surface such that with deflection of the spring the rear contact surface is moveable relative to the frame in a direction of a lengthwise axis of the clamp.

DETAILED DESCRIPTION

Figure 1A:
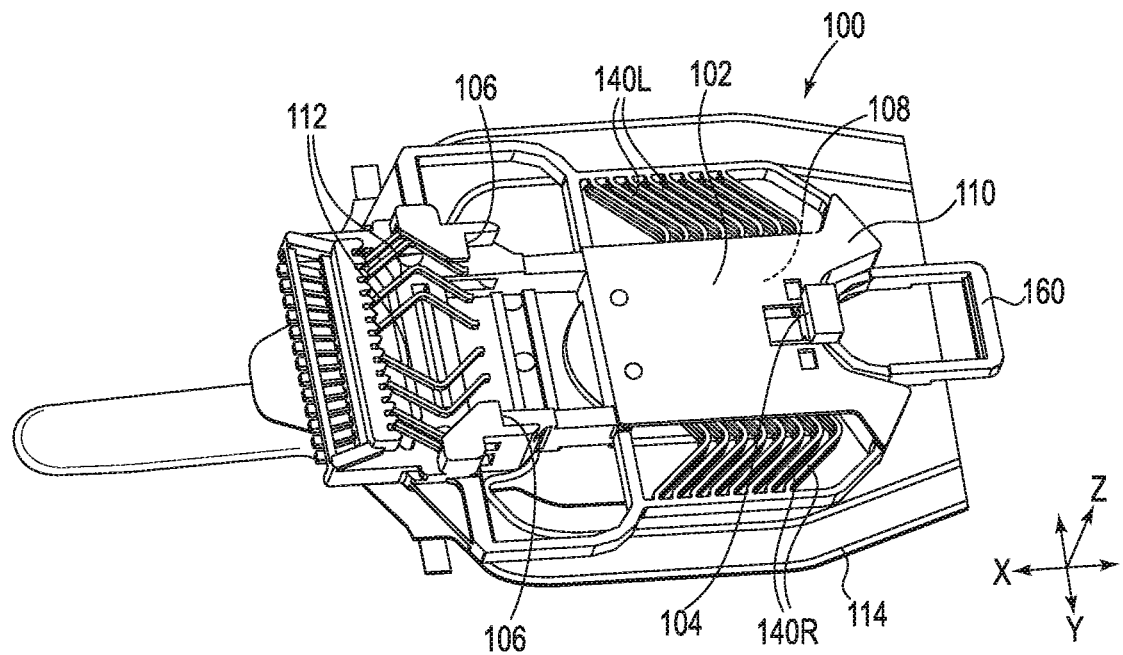
FIGS. 1A and 1B show top perspective views of an assembly that includes a clamp as described.

The presently-described invention relates to test sockets and related assemblies that include a clamp that is adapted to temporarily hold a slider of a hard disk drive. The clamp includes one or a set of springs that can be deflected relative to the slider and other structures of the clamp in a manner that allows the clamp to hold the slider temporarily and removably for electronic testing of the slider. The invention also relates to various assemblies that include one of the clamps, such as a head-gimbal assembly, an actuator assembly, a suspension assembly, an electronic testing assembly, etc., any of which is adapted for testing a slider while the slider is temporarily held in the clamp.

The clamp is a three-dimensional structure that can be considered to extend in two horizontal dimensions of length ("x") and width ("y"), and a vertical dimension of height ("z"). The clamp includes a "slider space" that is adapted to contain a slider during use of the clamp for electronic testing of the slider. According to the invention, a spring or a set of springs is located at a level of the clamp in a vertical ("z") direction that is below a vertical level of the slider space. Optionally and preferably, some or all of a spring or as set of springs can be located below and in a footprint of the slider space, i.e., in the area of the slider space that is taken up in the horizontal dimensions of length and width. This location of a spring of a clamp differs from previous test socket designs, which include springs at the same vertical level as the level of the slider space, which requires the springs to be located at left and right sides of the slider space to at least partially surround a perimeter the slider space. In these previous clamp designs, a spring cannot be located in the footprint of the slider space, i.e., in a space that overlaps the x- and y-locations of the slider space, but is located at a different (e.g., lower) location in a z-direction.

Advantageously, by placing a spring of a clamp at a lower vertical level of a clamp compared to the vertical level of the slider space (optionally and preferably with an at-least-partially-shared footprint), one or more of the shape, size, mass, center of gravity, and moment of inertia (about a longitudinal axis) of a clamp, test socket, or other assembly that includes the clamp, can be improved relative to one or more of these properties of a comparable spring-containing structure that includes springs at a vertical location that is shared with the slider space and that is necessarily completely outside of the footprint of the slider space. The described placement of a spring or a set of springs relative to a slider space of a clamp can be selected to produce one or more improved physical features of a clamp or test socket, and preferably improved functionality. For example, a spring, set of springs, or at least a portion thereof, can be placed at a location that is below a slider space and within the same vertical "footprint" of the slider space. This allows for a reduced overall footprint of a clamp or a test socket. This can also allow for a reduced total mass of a clamp, test socket, or another assembly that includes the clamp. A reduced mass or a selected center of gravity or moment of inertia of a clamp or test socket may be effective to improve a performance property of a clamp during testing of a slider, such as by reducing vibrations or wobbling of a test socket during use. Reduced wobbling or vibration can result in a reduced error rate of a slider during testing.

In general, a clamp as described can be considered to include structures of a stationary frame, a slider space, a rear contact surface that is stationary and is connected to the stationary frame, a spring or a set of springs attached at one end to the stationary frame (or a structure attached thereto), a forward contact surface that is attached directly or indirectly to a spring and that is moveable relative to the stationary frame, and a slider space between the forward contact surface and the rear contact surface.

The stationary frame can include a stationary rear frame member at a rear portion of the frame and extending in a width direction ("y" direction). Optionally, one or more additional stationary frame members may extend on each of a left side and right side of the clamp, from the rear frame member in a direction toward a front portion of the clamp. A rear contact surface is located at the rear portion of the clamp. The rear contact surface can be stationary relative to the stationary frame and may be connected directly or indirectly to the stationary rear frame member. At least one spring, e.g., a set of multiple springs, is located in a plane of the stationary frame; in other words, the spring or set of springs is located and extends in the length and width directions over an area of the clamp that is at a vertical level of the clamp that is the same as the vertical level of stationary frame. Preferably, the spring, set of springs, or a portion thereof, is located at a vertical level of the clamp that is below the slider space, and more preferably the spring, set of springs, or a portion thereof can be located at least in part underneath (below) the slider space, i.e., within the footprint of the slider space.

The clamp also includes a front contact surface at a front portion of the clamp. The front contact surface is non-stationary, i.e., is moveable, relative to the stationary frame, and is connected directly or indirectly to a spring. The front contact surface is located at a level of the clamp that is vertically above an upper surface of a spring. The front contact surface is directly or indirectly connected to a spring, and the spring is directly or indirectly connected to the stationary frame. As a result, the front contact surface is moveable relative to the stationary frame and the rear contact surface, e.g., in a length direction of the clamp, by applying a force to the front contact surface, which causes deflection of a spring along with movement of the front contact surface.

The clamp includes an open space (referred to herein as a "slider space") that extends in the length (x) direction and the width (y) direction, and that is located in a vertical direction at a vertical location that is above a plane of an upper surface of a spring or set of springs. The slider space is bounded at a rear portion by the stationary rear contact surface. The slider space is also bounded, at a front portion, by the moveable front contact surface. The front contact surface can be moved (e.g., pulled) in a length direction away from the rear contact surface, with deflection of a spring, to increase the size (length) of the slider space to allow a slider to be placed into the slider space. The slider will include a trailing edge that contacts the stationary rear contact surface. With the slider so located in the slider space, the front contact surface can be allowed to move back toward the rear contact surface, and will engage a leading edge of the slider located in the slider space. When located in the slider space the slider is electronically connected to a test socket or test suspension, so that the slider can be tested by dynamic electrical testing. After testing, the slider can be disengaged from the clamp by moving (pulling) the front contact surface away from the slider to disengage the front contact surface from the leading edge of the slider, and the slider can be moved in an upward direction and removed from the slider space.

In example devices and systems, a clamp as described can be included as part of a test socket attached to a suspension assembly. The test socket includes a head gimble assembly that includes the clamp. In presently useful examples, the test socket can be part of a suspension assembly that also includes a laminated flexure for electronically connecting the clamp and a slider held in the slider space of the clamp to a dynamic electrical testing system. The clamp can receive and hold the slider in temporary and removable manner, for testing. During testing, the claim provides an electrical connection between the slider and the testing system. The read-write capabilities of the slider are assessed by having the slider record and read data relative to a magnetic recording disk under typical use conditions. After testing is completed, the slider can be removed from the test socket, i.e., from the clamp, and another slider can be placed into the test socket and tested using the same test socket with the same head-gimbal-assembly and suspension assembly.

The slider can be a slider useful for any type of hard disk drive. Examples include sliders useful in perpendicular magnetic recording systems, heat-assisted-magnetic recording systems, or other types of magnetic recording systems and devices. A "slider" generally includes one or more miniaturized transducers for reading or writing data from or onto a rotating magnetic disk, and an air bearing surface that is effective to properly position the transducers above the disk as the disk rotates.

A heat-assisted magnetic recording ("HAMR") slider refers to a slider device that includes an electromagnetic read head (i.e., read head, write head, or both), an air bearing surface, and certain capabilities that allow the slider to be used for heat assisted magnetic recording, including optical capabilities and optical structure such as an optical waveguide that cooperates with a laser diode unit.

FIG. 1A shows a top perspective view of clamp 100 as described, which may be located at a distal end of a suspension assembly or head-gimbal assembly (HGA) (not shown). Clamp 100 is useful to hold a slider (not shown at FIG. 1A) for electronic testing of the slider. Clamp 100 includes a slider space 102 that is bounded in a length direction (an "x" direction at FIG. 1) between a front contact surface 104 at a "forward" position of the clamp, and a rear contact surface 106 at a rear portion of the clamp. Slider space 102 is also bounded underneath (below, vertically, in the "z" direction) by upper surface 108 of upper support member 110. A plurality of electrical connections 112 are located at a rear portion of clamp 100 to engage electrical contact pads (not shown) of the slider when the slider is located in slider space 102 (as in FIG. 1B). Electrical connections 112 are also electrically connected to laminated flexure 114, which connects to an electronic testing device (not shown).

Figure 1B:
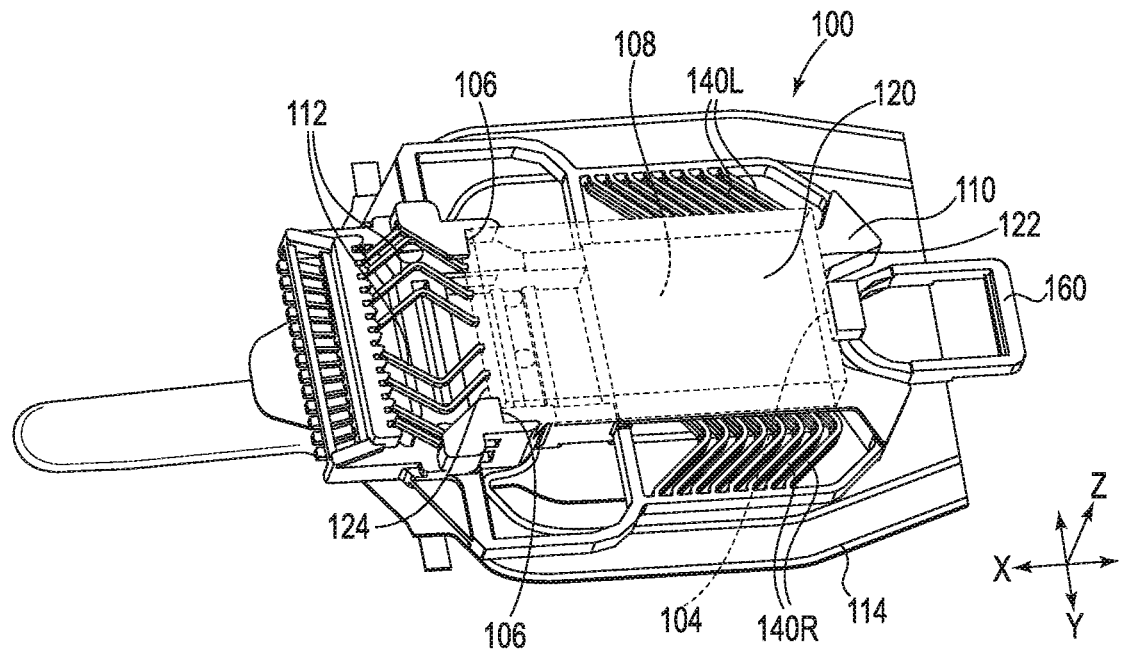

At FIG. 1B, slider 120 (in shadow) is illustrated as being held by clamp 100 within slider space 102. A bottom surface of slider 120 is supported by upper surface 108 of upper support member 110. A leading edge 122 of slider 120 is mechanically engaged with front contact surface 104. A trailing edge 124 of slider 120 is mechanically engaged with rear contact surface 106. Electrical contact pads (not shown) of slider 120 are electrically engaged with electrical connections 112. Springs 140 (140L, 140R) of clamp 100 are visible below upper support member 110. An open space (not shown) is present between upper surfaces of springs 140R and 140L and a bottom surface of upper support member 110.

Figure 2A:
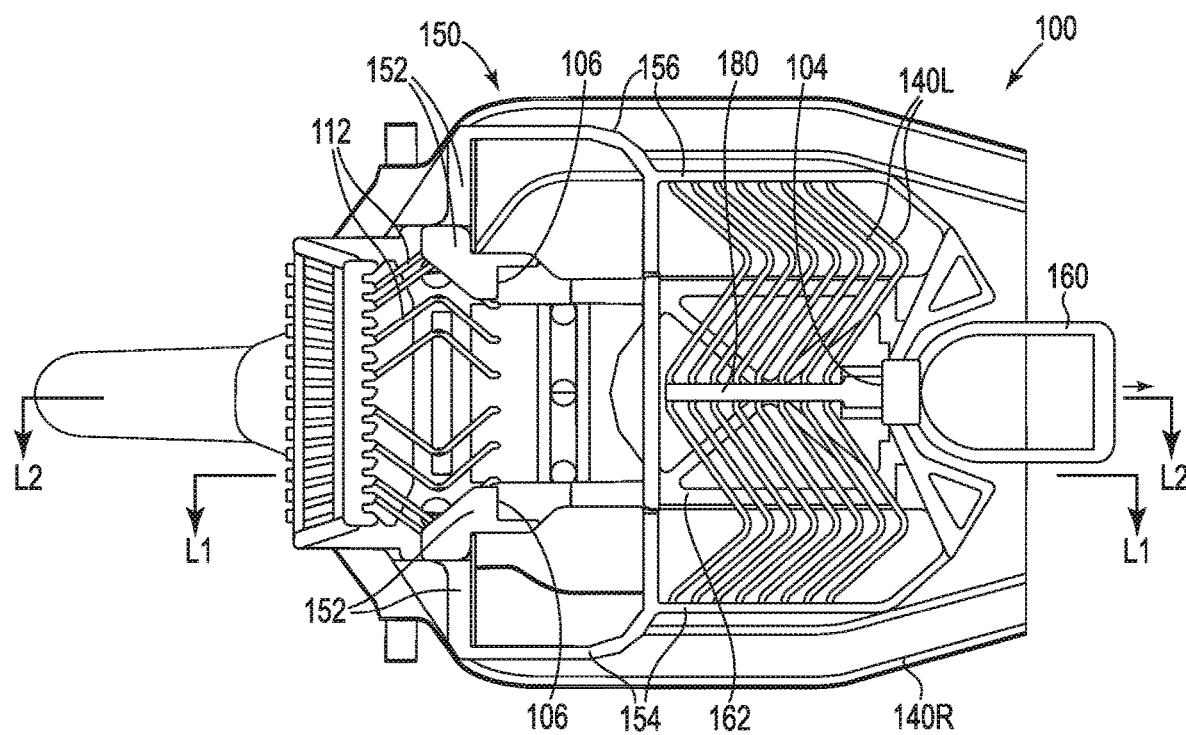
FIGS. 2A and 2B show top cut-away views of an assembly that includes a clamp as described.

FIG. 2A is a top cut-away view of clamp 100. This view shows: slider space 102 (not specifically shown) bounded in a length direction between front contact surface 104 at a "forward" position of the clamp and rear contact surface 106 at a "rear" portion of the clamp; electrical connections 112; and laminated flexure 114. Also shown are two sets of springs: 140L on a left side of clamp 110, and 140R on a right side of clamp 110. Each one of springs 140L and 140R is located at a vertical position (in the "z"-direction) of the clamp that is lower than the level of slider space 102, that is lower than the level of upper support member 110, and that is lower than the level of each of rear contact surface 106 and front contact surface 104.

Referring in more detail to FIG. 2A, other features of example clamp 100 include stationary frame 150 that, as illustrated, includes a stationary rear frame member 152 at a rear portion of the frame and extending in a width direction ("y" direction). On one side of clamp 100, e.g., a right side, and extending in the length direction from stationary rear frame member 152 and in a forward direction (toward a front portion of clamp 100) is stationary right-side frame member 154. On the other side of clamp 100, e.g., a left side, and extending in the length direction from stationary rear frame member 152 and in a forward direction (toward a front portion of clamp 100) is stationary left-side frame member 156. Handle 160 is also shown, connected to front contact surface 104 and axial member 180, which is connected to springs 140R and 140L.

Left-side springs 140L are located on the left side of the clamp and right-side springs 140R are located on the right side of the clamp. Each spring 140L has a central end attached to axial member 180 and a lateral end attached to stationary left-side frame member 156. Each right-side spring 140R has a central end attached to axial member 180 and a lateral end attached to stationary right-side frame member 154. Axial member 180 extends along a length-wise axis of clamp 100 and is connected to the central ends of springs 140R and 140L in a way that allows for the springs to become deflected as axial member 180 and front contact surface 104 (and optional handle 160) are moved longitudinally away from (see arrow at FIG. 2A) rear contact surface 106 and stationary frame 150.

Figure 2B:
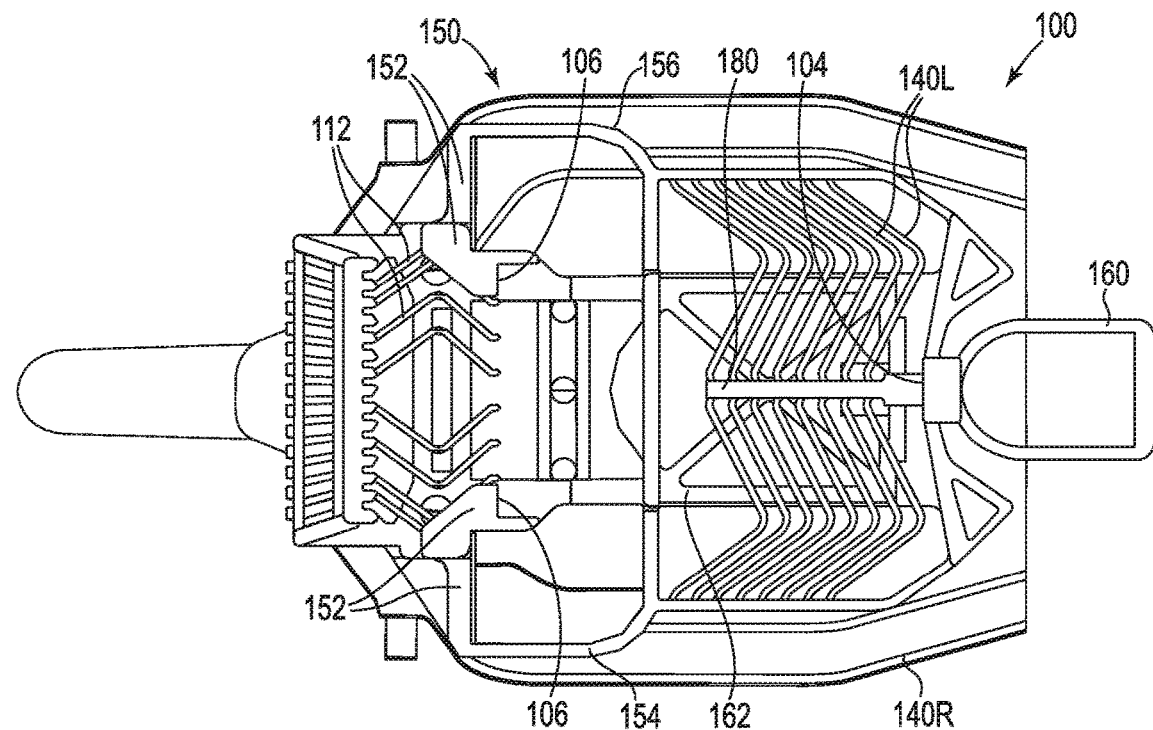

Shown at FIG. 2B is example clamp 100 of FIG. 2A with handle 160 pulled in a length direction away from frame 150. In this state, springs 140R and 140L are deflected (e.g., extended) and front contact surface 104 has been moved in the length direction away from rear contact surface 106 to increase a size of slider space 102 in the length direction. Also shown at FIGS. 2A and 2B is an optional bottom support member 162, which extends in the length and width directions and is stationary relative to stationary frame 150. An open space is present between an upper surface of bottom support member 162 and lower surfaces of springs 140R and 140L.

Figure 3A:
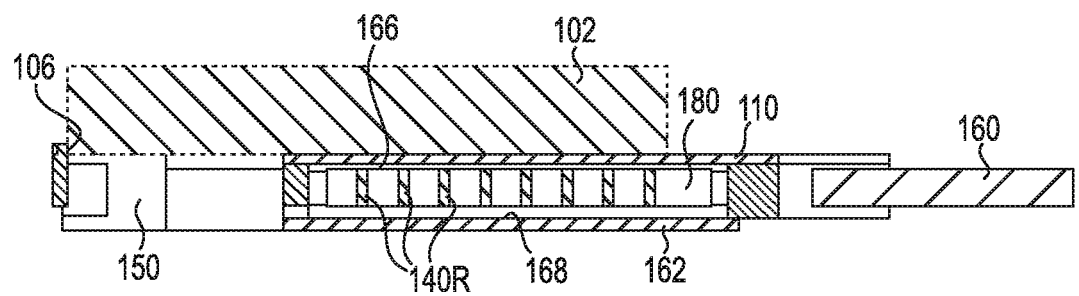
FIGS. 3A and 3B show side cut-away views of a clamp as described.
Figure 3B:
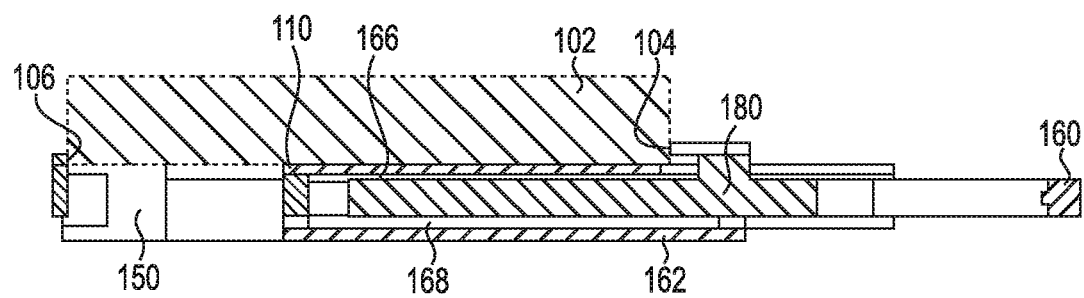

FIGS. 3A and 3B are side-cross sectional views of an example clamp as described, including features of clamp 100 of FIG. 1A, 1B, 2A, or 2B. FIG. 3A is a cross-sectional view taken along a section that extends in the length direction at an off-center line, e.g., at line "L1." FIG. 3B is a side-cross section view of the same example clamp 100, along a midline section that extends in the length direction at an off-center line, e.g., at line "L2."

Shown at FIGS. 3A and 3B are: slider (e.g., 120) situated within slider space 102, moveable front contact surface 104, stationary (relative to stationary frame 150 (shown out of depth)) rear contact surface 106 (out of depth), upper support member 110 (which is also stationary relative to frame 150), bottom support member 162 (which is stationary relative to frame 150), and handle 160. In FIG. 3B, handle 160 is illustrated as being pulled away from frame 150 to extend springs 140 R and to move front contact surface 104 away from rear contact surface 106. An open space 166 is present between a bottom surface of upper support member 110 and upper surfaces of springs 140R and axial member 180. An open space 168 is present between an upper surface of bottom support member 162 and lower surfaces of springs 140R and axial member 180.

FIGS. 3A and 3B (which are not necessarily to scale) allow for a discussion of relative sizes of different layers of a clamp 100 in a height (z) or "thickness" direction. The thickness of each layer of a clamp can be any thickness that will be effective for the layer to perform as described herein. A layer can be formed by deposition using a single deposition (e.g., electroplating) step or using multiple deposition steps. Examples of useful thicknesses of a layer can be from 0.01 millimeters (10 microns) to 120 microns, e.g., from 25 microns to 100 microns. Different structures can be of different specific thickness ranges. For example, a bottom support member or an upper support member may be thinner (less thick) than a spring or a frame. An example of a thickness of an upper support member or a lower support member can be in a range from 10 microns to 50 microns, e.g., from 15 to 40 microns or from 20 to 30 microns. An example of a thickness of a spring can be in a range from 10 microns to 130 microns, e.g., from 20 microns to 100 microns.

A clamp, according to any useful or preferred examples described herein, can have one or more springs or one or more sets of springs that together produce a useful force that is applied to a leading edge of a slider located in the slider space, by a forward contact surface. That force can be of a desired magnitude, for example in a range from 10 to 50 grams, e.g., from 15 to 35 or 30 grams (force).

Figure 4A:
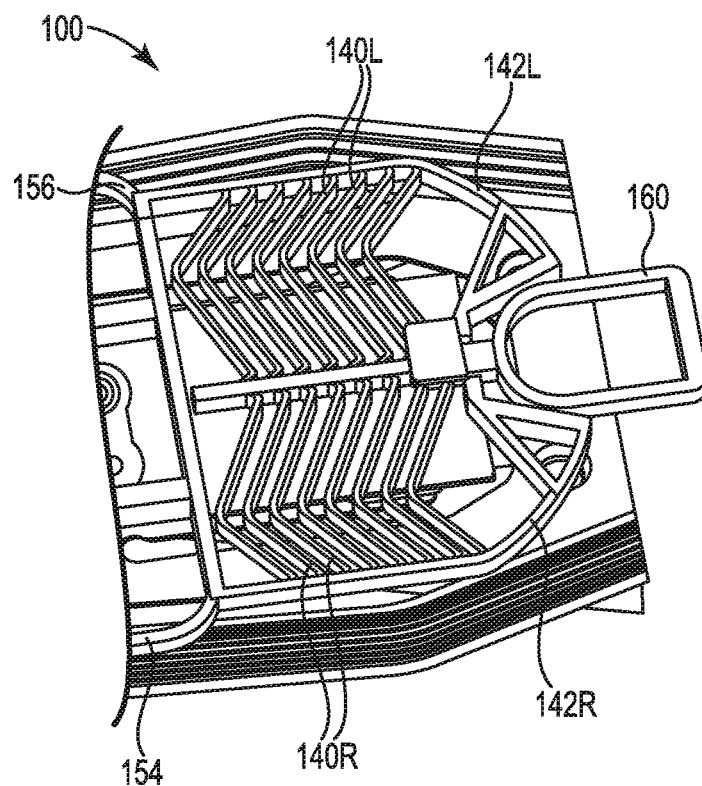
FIGS. 4A and 4B show top cut-away views of alternate examples of clamps as described, as part of an assembly.
Figure 4B:
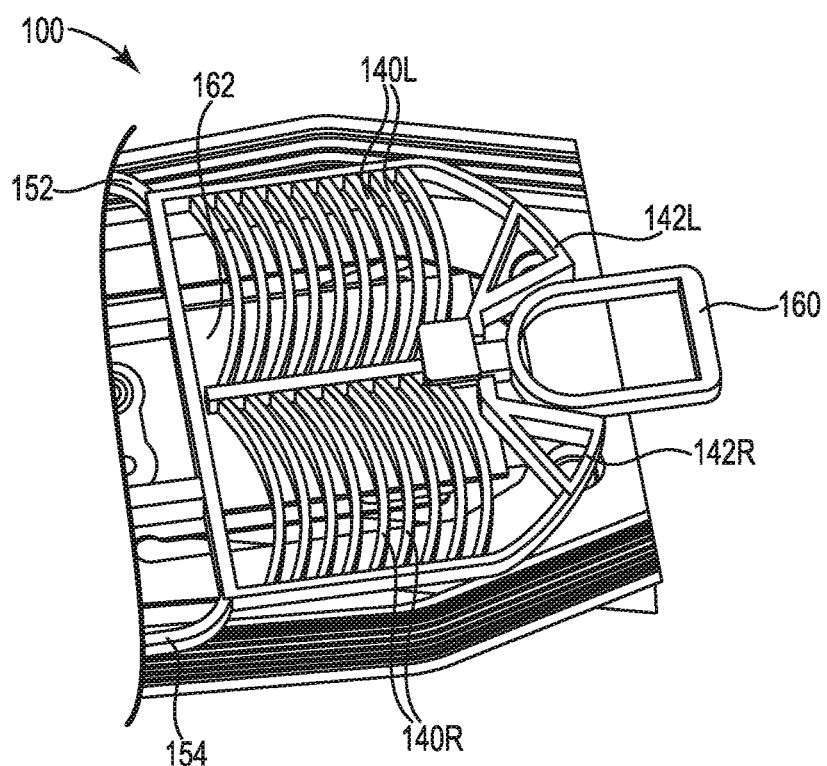
Figure 5A:
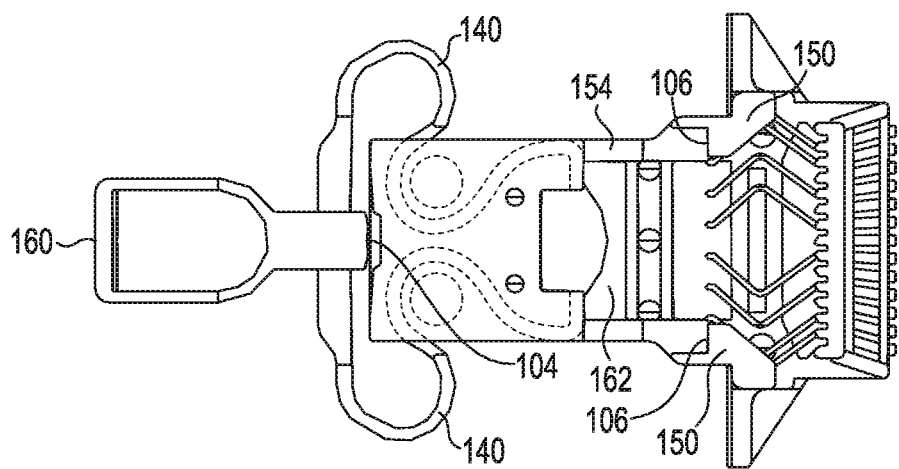
FIGS. 5A, 5B, and 5C show a top view, side cross-sectional view, and side perspective view of an example clamp of the present description.
Figure 5B:
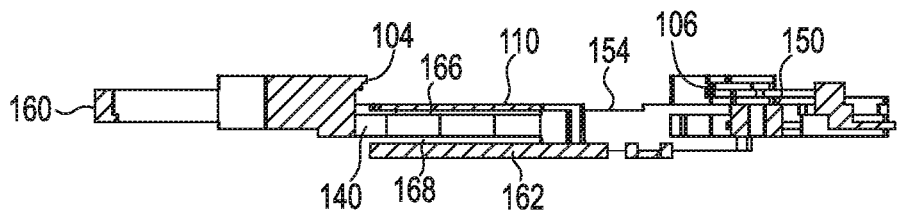
Figure 5C:
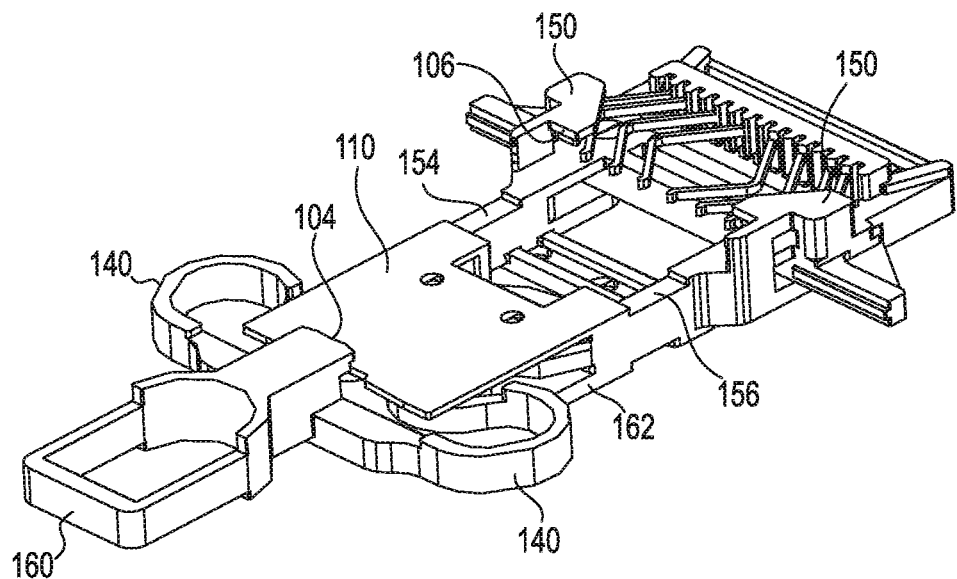
Figure 6A:
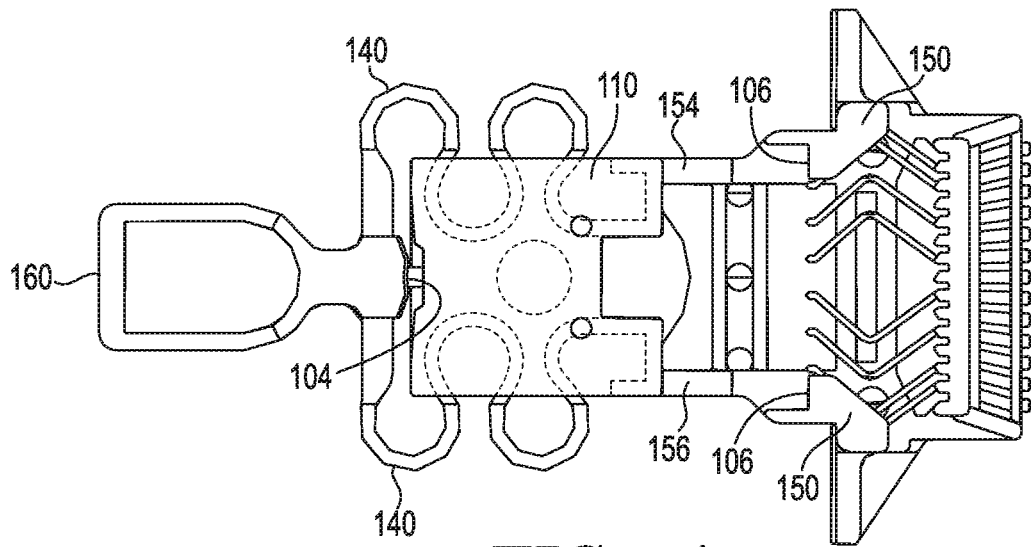
FIGS. 6A, 6B, and 6C show a top view, side cross-sectional view, and side perspective view of an example clamp of the present description.
Figure 6B:
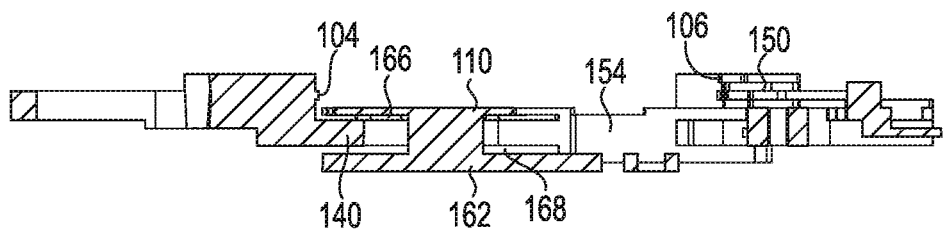
Figure 6C:
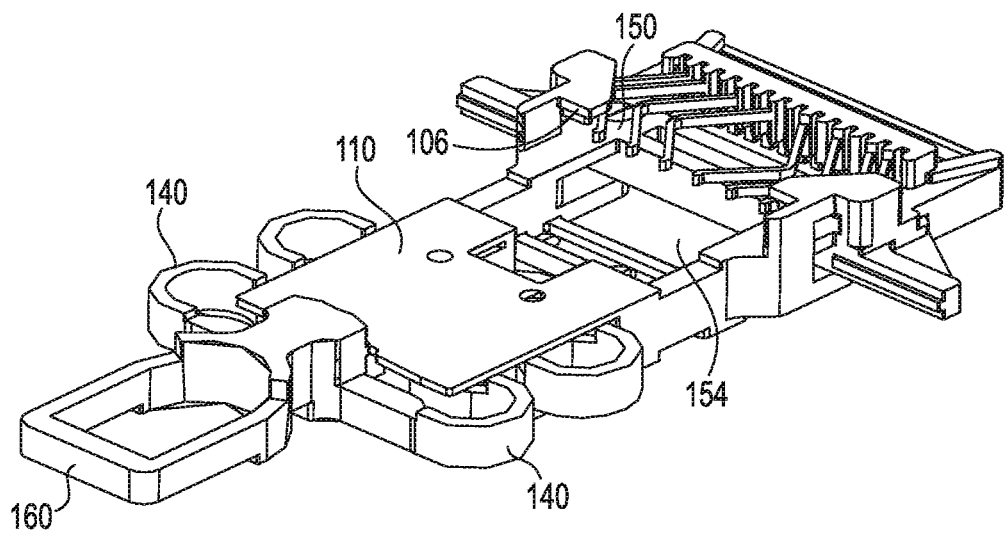

FIGS. 4A and 4B show two examples of clamp 100 with alternate versions of springs 140L and 140R. Other features of clamp 100 of these figures are identified by numbering that is consistent with numbering used throughout this description for comparable structures. FIGS. 4A and 4B show two sets of springs 140L and 140R on a left and a right side of clamp 100. Each set includes 8 or 9 individual springs, which can be curved or angled with corners between straight segments. In alternate embodiments more or fewer curves, angled corners, or straight sections may be included in an individual spring. Also, more or fewer springs may be included in a set; e.g., a set of springs (on a left side or a right side of a clamp) can include from 1 to 15 individual springs, for example from 3 to 21 springs, or from 4 to 12 springs. Note also that each of curved segments 142L and 142R functions as a spring and is deflected upon movement of handle 160 in a direction away from rear contact surface 106.

FIGS. 5A, 5B, 5C, 6A, 6B, and 6C show two additional examples of clamp 100 with alternate versions of springs 140. Each clamp includes just two springs, one spring on each of the left side and the right side. Each spring includes a loop (partial loop) or multiple loops (partial loops) that coil in the width and length directions, allowing the springs to deflect when handle 160 is pulled in a longitudinal direction away from rear contact surface 106.

Figure 7:
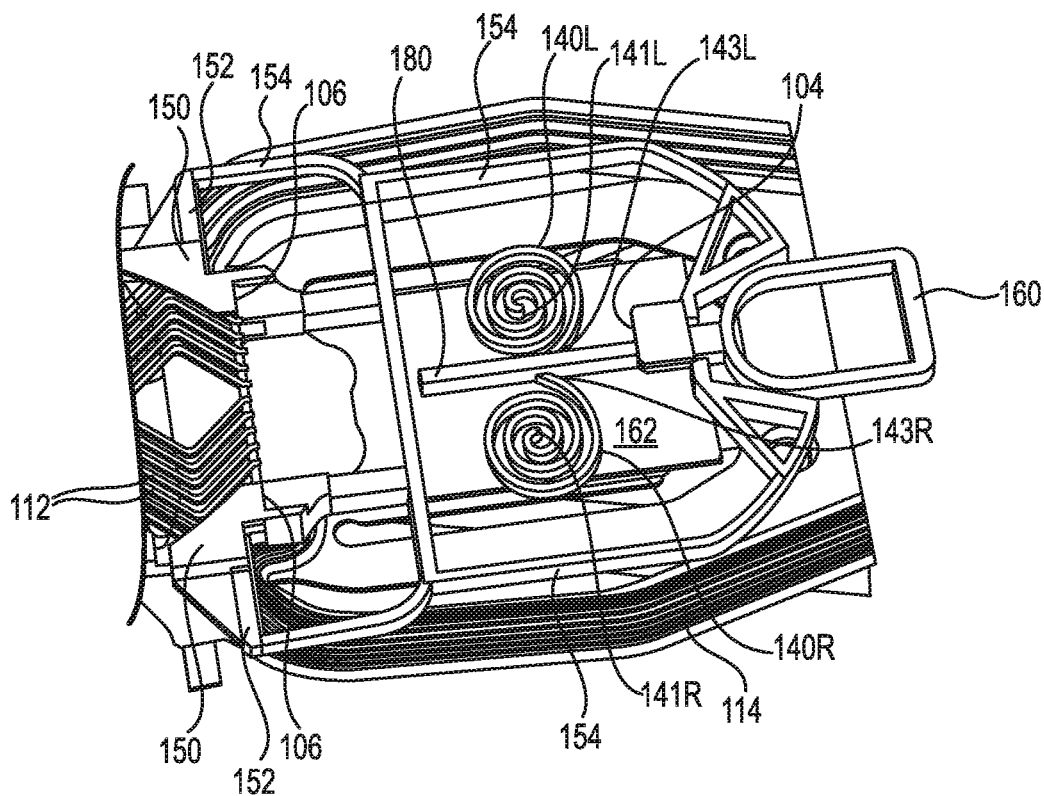
FIG. 7 shows a top cut-away view of an alternate example of a clamp as described, as part of an assembly.

FIG. 7 shows yet another example of clamp 100 with alternate versions of springs 140. Each clamp includes just two springs, one spring on each of the left side and the right side. Each spring includes a concentric spiral or loop having a fixed central end 141L, 141R that is fixed to lower support member 162, upper support member 110 (not shown), or both. A moveable end 143L, 143R of each spring is secured to axial member 180. When handle 160 is pulled in a longitudinal direction away from rear contact surface 106, springs 140L and 140R deflect and front contact surface 104 moves away from stationary rear contact surface 106.

A clamp as described herein can be made of a useful metal such as: palladium or a palladium alloy, nickel or a nickel alloy such as an alloy of nickel and cobalt (NiCo), steel, stainless steel, copper or a copper alloy, titanium or a titanium alloy, or the like. Useful metals and metal alloys include those that are capable of being deposited as a film by electrodeposition (electroplating) techniques.

A clamp as described can be prepared by any method that is found to be useful to prepare the clamp. Example methods include methods useful for depositing metal or metal alloy films, such as electrodeposition or electroplating, specifically including methods referred to as "microscale additive manufacturing" that also involve the use of photolithographic techniques to form multiple sequential patterned layers of a structure (e.g., a clamp), progressively, in a vertical direction. According to such methods, a small scale (e.g., micro-scale) multi-layer metal structure such as a clamp may be built up by steps of depositing, one layer on top of a previous layer, multiple single layers of sacrificial support material and electroplated metal. Each layer includes a pattern made from these two materials—a positive portion corresponds to metal that is a layer of the clamp, and a patterned (negative) portion of sacrificial support material corresponds to spaces between metal structures of the clamp. Each layer is present at a single vertical level of the clamp. The material of a layer of the clamp is metal, and the material of open spaces between metal clamp structures is filled with the sacrificial support material. After the multiple layers of metal and sacrificial support material are deposited, the sacrificial support material is chemically removed from the assembled layers of metal clamp material to leave the layers of deposited metal, which have been bonded together during the deposition (e.g., electroplating) steps.

A test socket that incorporates a clamp described can be used in a suspension assembly of a dynamic electrical testing system to provide temporary electrical connection with a slider for dynamic electrical testing of the slider. A slider can be placed in the clamp and the clamp can be closed to secure the slider for electrical testing. After testing the slider can be removed and another slider can placed in the clamp for testing. Examples of head gimbal assemblies, suspension assemblies, and testing systems and assemblies are described in U.S. Pat. Nos. 8,089,730, and 8,514,522, the entireties of which are incorporated herein by reference.

Figure 8:
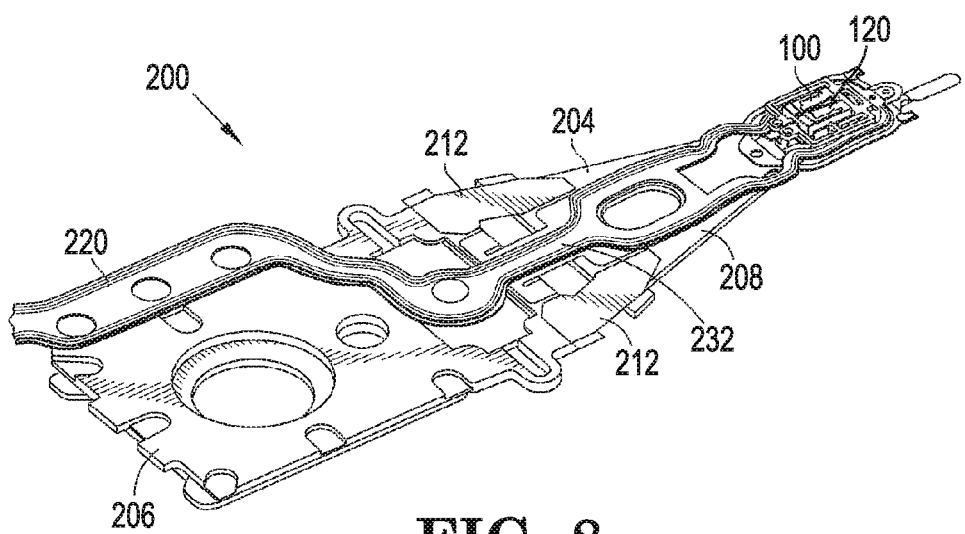
FIG. 8 shows a perspective view of a head-gimbal assembly that includes a clamp as described.

Referring to FIG. 8, this shows a perspective view of a head-gimbal assembly (HGA) 200 that includes a clamp, read head (a.k.a. "slider") 120, and suspension assembly 206, as a single example of a head-gimbal assembly of the present description. Clamp 100 can include features as described herein (details not shown). As illustrated, clamp 100 holds slider 120 and provides a plurality of electrical connections thereto. The suspension assembly 206 includes suspension mounting plate 208, and a load beam 210 attached to suspension mounting plate 208 (for example via hinge plates 212). Load beam 210 may be made of a metal such as stainless steel, for example. Suspension assembly 206 also includes a laminated flexure 220.

The invention claimed is:

1. A clamp for removably holding a slider, the clamp comprising:
   a stationary frame that includes a stationary rear frame member at a rear portion of the frame, extending in a width direction,
   springs extending in a horizontal plane of the stationary frame,
   an open space extending in a length direction and the width direction and located above an upper surface of the spring, the open space being defined in the length direction in part by:
      a front contact surface at a forward portion of the clamp, extending above the horizontal plane, and
      a rear contact surface at a rear portion of the clamp, extending above the horizontal plane; and
   the spring connects the stationary frame with the rear contact surface such that with deflection of the spring the rear contact surface is moveable relative to the frame in a direction of a lengthwise axis of the clamp,
   the clamp further comprising:
      a stationary left-side frame member at a left portion of the frame, extending from a forward frame member in a length direction toward a rear portion of the frame, and
      a stationary right-side frame member at a right portion of the frame, extending from a forward frame member in a length direction toward the rear portion of the frame, and
   wherein:
      the springs comprise a set of left-side springs on a left side of the clamp, each spring having a central end attached to an axial member and a lateral end attached to the stationary left-side frame member,
      the springs comprise a set of right-side springs on a right side of the clamp, each spring having a central end attached to an axial member and a lateral end attached to the stationary right-side frame member,
      the axial member extends along a lengthwise axis of the frame and is connected to the springs such that with deflection of the springs the axial member is moveable relative to the stationary frame in a direction of the lengthwise axis of the clamp, and
      the rear contact surface is connected to the axial member.

2. A clamp of claim 1 wherein the set of right-side springs includes from 4 to 21 springs and the set of left-side springs includes from 4 to 21 springs.

3. A clamp of claim 1 comprising an upper support member that is stationary relative to the stationary frame, the upper support member comprising an upper support surface that extends in the width direction and the length direction at a level below a height of the front contact surface and below a height the rear contact surface, that defines a bottom of the space, and that extends over at least a portion of a spring.

4. A clamp of claim 3 comprising vertical separation between a lower surface of the upper support member and an upper surface of the spring.

5. A clamp of claim 1 comprising a lower support member that extends in the width direction and the length direction at a level below a lower surface of a spring.

6. A clamp of claim 5 comprising vertical separation between an upper surface of the lower support member and a lower surface of a spring.

7. A clamp of claim 1 wherein the springs are made of metal.

8. A clamp of claim 1 wherein the springs are made from metal selected from palladium, a nickel-carbon alloy, copper or a copper alloy, nickel or a nickel alloy, iron alloy, steel, titanium or a titanium alloy.

9. A clamp of claim 1 comprising a set of electrical contacts at a forward location of the slider space.

10. A clamp of claim 1 comprising a handle connected to the rear contact surface and spring, the handle having a size and shape that can be manually grasped and pulled in a direction away from the forward contact surface.

11. An electronic test assembly comprising a clamp of claim 1 secured to a gimbal of an electrical testing device.

12. A method of using a clamp of claim 1, the method comprising:
  placing a slider in the clamp, and
  testing the electrical functionality of the slider by dynamic electrical testing,
  after testing, removing the slider from the clamp, and placing a second slider in the clamp.

13. A clamp for removably holding a slider, the clamp comprising:
  a stationary frame that includes a stationary rear frame member at a rear portion of the frame, extending in a width direction,
  a spring extending in a horizontal plane of the stationary frame,
  an open space extending in a length direction and the width direction and located above an upper surface of the spring, the open space being defined in the length direction in part by:
    a front contact surface at a forward portion of the clamp, extending above the horizontal plane, and
    a rear contact surface at a rear portion of the clamp, extending above the horizontal plane; and
  the spring connects the stationary frame with the rear contact surface such that with deflection of the spring the rear contact surface is moveable relative to the frame in a direction of a lengthwise axis of the clamp,
wherein the spring has a height in a range from 10 to 130 microns.

14. A clamp of claim 13 comprising a handle connected to the rear contact surface and spring, the handle having a size and shape that can be manually grasped and pulled in a direction away from the forward contact surface.

15. An electronic test assembly comprising a clamp of claim 13 secured to a gimbal of an electrical testing device.

16. A method of using a clamp of claim 13, the method comprising:
  placing a slider in the clamp, and
  testing the electrical functionality of the slider by dynamic electrical testing,
  after testing, removing the slider from the clamp, and
  after removing the slider from the clamp, placing a second slider in the clamp.

17. A clamp for removably holding a slider, the clamp comprising:
  a stationary frame that includes a stationary rear frame member at a rear portion of the frame, extending in a width direction,
  one or more springs extending in a horizontal plane of the stationary frame,
  an open space extending in a length direction and the width direction and located above an upper surface of the spring, the open space being defined in the length direction in part by:
    a front contact surface at a forward portion of the clamp, extending above the horizontal plane, and
    a rear contact surface at a rear portion of the clamp, extending above the horizontal plane; and
  the one or more springs connect the stationary frame with the rear contact surface such that with deflection of the one or more springs the rear contact surface is moveable relative to the frame in a direction of a lengthwise axis of the clamp,
wherein, with a slider positioned in the clamp, the one or more springs produce a force in a range from 10 to 50 grams (force).

18. A clamp of claim 17 comprising a handle connected to the rear contact surface and spring, the handle having a size and shape that can be manually grasped and pulled in a direction away from the forward contact surface.

19. An electronic test assembly comprising a clamp of claim 17 secured to a gimbal of an electrical testing device.

20. A method of using a clamp of claim 17, the method comprising:
  placing a slider in the clamp, and
  testing the electrical functionality of the slider by dynamic electrical testing,
  after testing, removing the slider from the clamp, and
  after removing the slider from the clamp, placing a second slider in the clamp.

* * * * *

UNITED STATES PATENT AND TRADEMARK OFFICE
CERTIFICATE OF CORRECTION

PATENT NO. : 11,195,559 B2
APPLICATION NO. : 16/895680
DATED : December 7, 2021
INVENTOR(S) : Sungkwon Choi et al.

It is certified that error appears in the above-identified patent and that said Letters Patent is hereby corrected as shown below:

In the Claims

Column 10, Line 41, "the rear contact" should be -- the front contact --.
Column 10, Line 42, "the rear" should be -- the front --.
Column 10, Line 67, "the rear contact surface" should be -- the front contact surface --.

Column 11, Line 28, "a forward location" should be -- a rear portion --.
Column 11, Line 30, "the rear contact surface" should be -- the front contact surface --.
Column 11, Line 32, "the forward contact surface" should be -- the rear contact surface --.

Column 12, Line 1, "the rear contact" should be -- the front contact --.
Column 12, Line 2, "the rear" should be -- the front --.
Column 12, Line 8, "the rear contact surface" should be -- the front contact surface --.
Column 12, Line 10, "the forward contact surface" should be -- the rear contact surface --.
Column 12, Line 37, "the rear contact surface" should be -- the front contact surface --.
Column 12, Line 38, "the rear contact surface" should be -- the front contact surface --.

Signed and Sealed this
Eleventh Day of July, 2023

Katherine Kelly Vidal
*Director of the United States Patent and Trademark Office*